United States Patent
Yang et al.

(10) Patent No.: US 10,790,339 B2
(45) Date of Patent: Sep. 29, 2020

(54) OLED ARRAY SUBSTRATE AND MANUFACTURING METHOD THEREOF, AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Zhongying Yang, Beijing (CN); Jianpeng Wu, Beijing (CN); Yinan Liang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 59 days.

(21) Appl. No.: 16/094,285

(22) PCT Filed: Feb. 24, 2018

(86) PCT No.: PCT/CN2018/077118
§ 371 (c)(1),
(2) Date: Oct. 17, 2018

(87) PCT Pub. No.: WO2018/161809
PCT Pub. Date: Sep. 13, 2018

(65) Prior Publication Data
US 2019/0131358 A1   May 2, 2019

(30) Foreign Application Priority Data
Mar. 7, 2017   (CN) .................... 2017 2 0216513 U (51) Int. Cl.
*H01L 27/32* (2006.01)
*H01L 51/56* (2006.01)

(52) U.S. Cl.
CPC ...... *H01L 27/3218* (2013.01); *H01L 27/3211* (2013.01); *H01L 27/3213* (2013.01); *H01L 27/3216* (2013.01); *H01L 51/56* (2013.01)

(58) Field of Classification Search
CPC ............. H01L 27/3213; H01L 27/3216; H01L 27/3218
See application file for complete search history.

(56) References Cited

FOREIGN PATENT DOCUMENTS

| CN | 104037199 A | * | 9/2014 |
| CN | 104037199 A |   | 9/2014 |

(Continued)

OTHER PUBLICATIONS

International Search Report and Written Opinion dated May 30, 2018; PCT/CN2018/077118.

*Primary Examiner* — Zandra V Smith
*Assistant Examiner* — Molly K Reida (57) ABSTRACT

Provided are an OLED array substrate and a manufacturing method thereof, and a display device. The OLED array substrate includes a substrate and a plurality of pixel units provided thereon. The plurality of pixel units are arranged into a plurality of rows extending in a first direction and a plurality of columns extending in a second direction. Each pixel unit includes a plurality of subpixels emitting light of different colors. At least two subpixels emitting light of the same color are adjacent to each other in at least one of the first direction and the second direction.

14 Claims, 4 Drawing Sheets

(56) References Cited

FOREIGN PATENT DOCUMENTS

| CN | 104778919 A | 7/2015 |
| CN | 204991713 U | 1/2016 |
| CN | 206564254 U | 10/2017 |

* cited by examiner

FIG. 7 by using one first opening in a first mask, depositing a first light-emitting layer pattern as light-emitting layers of at least two of the first sub-pixels emitting light of a first color and adjacent to each other in at least one of a first direction and a second direction performing at least one of operations of translation and rotation for the first mask by using the one first opening in the first mask, depositing a second light-emitting layer pattern as light-emitting layers of at least two of the second sub-pixels emitting light of a second color and adjacent to each other in at least one of the first direction and the second direction by using one second opening in a second mask, depositing a third light-emitting layer pattern as light-emitting layers of at least two of the third sub-pixels emitting light of a third color and adjacent to each other in at least one of the first direction and the second direction.

FIG. 8

OLED ARRAY SUBSTRATE AND MANUFACTURING METHOD THEREOF, AND DISPLAY DEVICE

The present application claims priority of Chinese Patent Application No. 201720216513.5 filed on Mar. 7, 2017, the disclosure of which is incorporated herein by reference in its entirety as part of the present application.

TECHNICAL FIELD

Embodiments of the present disclosure relate to an OLED array substrate and a manufacturing method thereof and a display device.

BACKGROUND

With development of a display technology, people demand higher and higher on a display effect of an Organic Light emitting Diode (OLED) display product, so it is especially important to fabricate a display device with high Pixels Per Inch (PPI), high brightness and long service life.

At present, a film-forming technology of an organic light-emitting material is mainly in a mode of vacuum evaporation. A fine metal mask (FMM) is used in an evaporation process to limit evaporation regions of light-emitting materials of different colors. Therefore, in the evaporation procedure, it is necessary to consider not only limitation of process alignment on the evaporation process, but also more importantly influence of fabrication precision of the FMM on the vacuum evaporation process. At present, with improvement of the PPI of the OLED display product, due to a gradually reduced opening size of an evaporation pattern of the FMM required, together with limitation of the evaporation process and a material performance, fabrication precision of the FMM gradually reaches the limit. Thus, it is hardly to continue to improve the PPI of the display product by reducing the opening size of the evaporation pattern of the FMM. In addition, in the prior art, a distance between two sub-pixels is relatively small, so in the evaporation procedure, a light-emitting material of one color is apt to shift to a position of a light-emitting material of another color, so that a color actually displayed by the sub-pixel at the position is not the expected color, rendering poor color mixing of a screen.

SUMMARY

An embodiment of the present disclosure provides an OLED array substrate, including a base substrate and a plurality of pixel units thereon, wherein, the plurality of pixel units is arranged in a plurality of rows extending in a first direction and a plurality of columns extending in a second direction, each of the pixel units includes a plurality of sub-pixels emitting light of different colors, at least two of the sub-pixels emitting light of a same color are adjacent to each other in at least one selected from the group consisting of the first direction and the second direction.

For example, light-emitting layers of the at least two sub-pixels emitting light of the same color and adjacent to each other in at least one selected from the group consisting of the first direction and the second direction are integrally formed.

For example, the sub-pixels of each of the pixel units include one first sub-pixel, one second sub-pixel and two third sub-pixels; the first sub-pixel, the second sub-pixel and the two third sub-pixels emit light of different colors; the first sub-pixel and the second sub-pixel are diagonally provided, the two third sub-pixels are diagonally provided, and a connection line between the first sub-pixel and the second sub-pixel and a connection line between the two third sub-pixels intersect with each other.

For example, light-emitting regions of the first sub-pixel and the second sub-pixel are the same in size and shape, and light-emitting regions of the two third sub-pixels are the same in size and shape.

For example, the OLED array substrate includes: a continuous first light-emitting layer pattern, wherein, an orthographic projection of light-emitting regions of at least two of the first sub-pixels adjacent to each other in at least one selected from the group consisting of the first direction and the second direction on the base substrate is located within an orthographic projection of the first light-emitting layer pattern on the base substrate; a continuous second light-emitting layer pattern, wherein, an orthographic projection of light-emitting regions of at least two of the second sub-pixels adjacent to each other in at least one selected from the group consisting of the first direction and the second direction on the base substrate is located within an orthographic projection of the second light-emitting layer pattern on the base substrate; and a continuous third light-emitting layer pattern, wherein, a orthographic projection of light-emitting regions of at least four of the third sub-pixels adjacent to one another in the first direction and the second direction on the base substrate is located within an orthographic projection of the third light-emitting layer pattern on the base substrate.

For example, the first light-emitting layer pattern, the second light-emitting layer pattern and the third light-emitting layer pattern all have a planar shape of convex polygon.

For example, the OLED array substrate includes: a continuous light-emitting layer pattern, wherein, an orthographic projection of light-emitting regions of at least two of the third sub-pixels adjacent to each other in at least one selected from the group consisting of the first direction and the second direction on the base substrate is located within an orthographic projection of the light-emitting layer pattern on the base substrate.

For example, the light-emitting layer pattern has a planar shape of convex polygon.

For example, shapes of the light-emitting regions of the first sub-pixel and the second sub-pixel include a triangle, a pentagon, a trapezoid, a semicircle or a hexagon; and a shape of the third sub-pixel include a rectangle, a circle, a sector, a triangle, a trapezoid or a hexagon.

For example, the first sub-pixel is a red sub-pixel, the second sub-pixel is a green sub-pixel, and the third sub-pixels are blue sub-pixels.

Another embodiment of the present disclosure provides a display device, including any of the above described OLED array substrate.

Another embodiment of the present disclosure provides a manufacturing method of any of the above described OLED array substrate, including: by using one first opening in a first mask, depositing a first light-emitting layer pattern as light-emitting layers of at least two of the first sub-pixels emitting light of the first color and adjacent to each other in at least one selected from the group consisting of a first direction and a second direction.

For example, the sub-pixels of each of the pixel units include one first sub-pixel, one second sub-pixel and two third sub-pixels; the first sub-pixel, the second sub-pixel and the two third sub-pixels emit light of different colors; the first sub-pixel and the second sub-pixel are diagonally provided, the two third sub-pixels are diagonally provided, and a connection line between the first sub-pixel and the second sub-pixel and a connection line between the two third sub-pixels intersect with each other, wherein, an orthographic projection of light-emitting regions of at least two of the first sub-pixels adjacent to each other in at least one selected from the group consisting of the first direction and the second direction on the base substrate is located within a orthographic projection of the first light-emitting layer pattern on the base substrate.

For example, after depositing the first light-emitting layer pattern, the manufacturing method further includes: by using the one first opening in the first mask, depositing a second light-emitting layer pattern as light-emitting layers of at least two of the second sub-pixels emitting light of the second color and adjacent to each other in at least one selected from the group consisting of the first direction and the second direction; wherein, an orthographic projection of light-emitting regions of the at least two of the second sub-pixels adjacent to each other in at least one selected from the group consisting of the first direction and the second direction on the base substrate is located within an orthographic projection of the second light-emitting layer pattern on the base substrate.

For example, after depositing the first light-emitting layer pattern and before depositing the second light-emitting layer pattern, the manufacturing method further includes: performing at least one selected from the group consisting of operations of translation and rotation for the first mask.

For example, the manufacturing method of the OLED array substrate further includes: by using one second opening in a second mask, depositing a third light-emitting layer pattern as light-emitting layers of at least two of the third sub-pixels emitting light of a same color and adjacent to each other in at least one selected from the group consisting of the first direction and the second direction; wherein, an orthographic projection of light-emitting regions of the at least two of the third sub-pixels adjacent to each other in at least one selected from the group consisting of the first direction and the second direction on the base substrate is located within an orthographic projection of the third light-emitting layer pattern on the base substrate.

The array substrate provided by the embodiments of the present disclosure has higher resolution and aperture ratio. The manufacturing method of the array substrate provided by the embodiments of the present disclosure has a simplified process flow and low cost; the display device provided by the embodiments of the present disclosure has optimized brightness and lifetime.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

The OLED array substrate provided by the embodiments of the present disclosure can effectively improve PPI and aperture ratio of an OLED display device without increasing difficulty in fabricating an FMM under existing process conditions, and reduce an incidence rate of poor color mixing of the display device.

Figure 1:
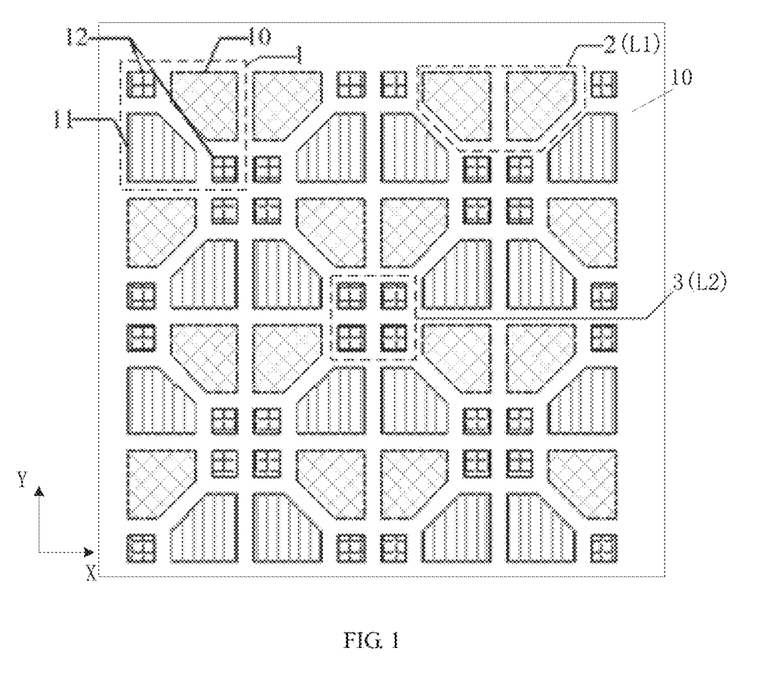
FIG. 1 is a top plan view of a structure of an OLED array substrate provided by an embodiment of the present disclosure.

An embodiment of the present disclosure provides an OLED array substrate 100, as shown in FIG. 1, including a base substrate 10 and a plurality of pixel units 1 thereon. The plurality of pixel units 1 is arranged in an array. The plurality of pixel units 1 are arranged in a plurality of rows extending in an X direction (i.e., a first direction) and a plurality of columns extending in a Y direction (i.e., a second direction). Each pixel unit 1 includes a plurality of sub-pixels of different colors. At least two of the sub-pixels of a same color are adjacent to each other in at least one of the first direction and the second direction. Here, that two sub-pixels are adjacent in a certain direction refers to that there is no other sub-pixel in the certain direction passing through the two sub-pixels. In the array of pixel units 1, light-emitting layer patterns of adjacent sub-pixels of a same color can be formed through a same opening of a mask pattern. Here, the sub-pixels of the same color refer to the sub-pixels that emit light of the same color. That is, light-emitting layers of the at least two sub-pixels of the same color and adjacent to each other in at least one of the first direction and the second direction are integrally formed through a same opening of the mask.

In all embodiments of the present disclosure, the respective sub-pixels are all shown with their active light-emitting regions.

The sub-pixel in the OLED array substrate is made of an organic light-emitting material in a mode of vacuum evaporation. In an evaporation procedure, a pattern of the sub-pixel is formed correspondingly by providing an opening of the mask on the mask. By enabling light-emitting layer patterns of adjacent sub-pixels of a same color to be formed through one opening of mask, a size of the opening of the mask on the mask can be increased, and a gap between adjacent sub-pixels can be reduced, so that PPI and an aperture ratio of an OLED display product can be improved without increasing difficulty in fabricating the mask, that is, difficulty in the fabrication process of the mask can be reduced under a condition that the same PPI and the same aperture ratio of the OLED display product are ensured, which further reduces difficulty in an evaporation process of the sub-pixels, improves a yield of the OLED display product, and also improves brightness and life of the OLED display product, and meanwhile, reduces preparation costs of the OLED display product.

In this embodiment, the pixel unit 1 includes one first sub-pixel 10, one second sub-pixel 11 and two third sub-pixels 12. The first sub-pixel 10 and the second sub-pixel 11 are diagonally provided, the two third sub-pixels 12 are diagonally provided, and a connection line between the first sub-pixel 10 and the second sub-pixel 11 and a connection line between the two third sub-pixels 12 intersect with each other. The arrangement facilitates light-emitting layer patterns of adjacent sub-pixels of the same color in subsequent adjacent pixel units 1 to occupy a larger-sized pattern region. With such configuration, light-emitting layers of the plurality of sub-pixels of the same color can be facilitated to be formed in one time only through an opening of one mask, which not only saves preparation costs of the OLED array substrate, without increasing difficulty in fabricating the mask, but also reduces difficulty in the evaporation process of the sub-pixel, with the PPI and the aperture ratio of the OLED display product improved, so as to improve brightness and life of the OLED display product.

For example, in this embodiment, the first sub-pixel 10 and the second sub-pixel 11 are the same in size and shape, and the two third sub-pixels 12 are the same in size and shape. The arrangement facilitates light-emitting layer patterns of adjacent sub-pixels of the same color to have a relatively regular pattern region, which, thus, not only reduces difficulty in fabricating the mask, but also results in uniform display brightness of the OLED display product, so as to improve a display effect of the OLED display product.

It should be noted that, the first sub-pixel 10 and the second sub-pixel 11 may also be different in size and shape, and the two third sub-pixels 12 may also be different in size and shape, that is, sizes and shapes of the first sub-pixel 10, the second sub-pixel 11 and the third sub-pixels 12 will not be limited to the above-described modes in this embodiment, but can be set arbitrarily, as long as light-emitting layer patterns of adjacent sub-pixels of the same color in adjacent pixel units 1 can occupy a larger-sized pattern region.

Figure 2:
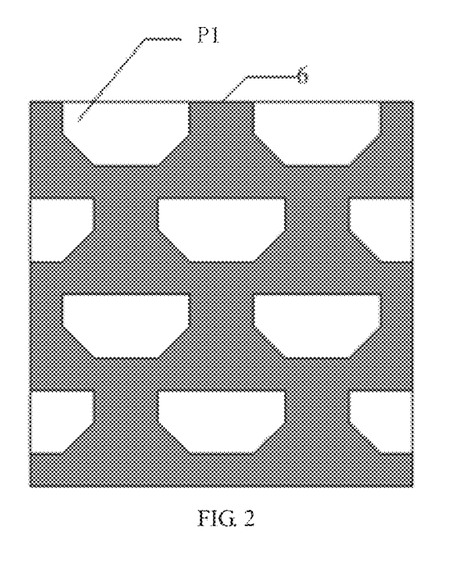
FIG. 2 is a top plan view of a structure of a mask with an opening of a first pattern region provided by the embodiment of the present disclosure.

For example, in this embodiment, in the row direction (i.e., the first direction) in which pixel units 1 are arranged, in any two adjacent pixel units 1, two first sub-pixels 10 are adjacent to each other in the row direction, or two second sub-pixels 11 are adjacent in the row direction, and active light-emitting regions of the two adjacent first sub-pixels 10 are both arranged within a first pattern region 2 (as shown in FIG. 2). For example, with reference to FIG. 1 and FIG. 2, a first light-emitting layer pattern L1 filling the first pattern region 2 is formed through the same one first opening P1 of a mask 6. For example, the first pattern region 2 and the first opening P1 are substantially the same in shape and size. A plane size of the first pattern region 2 is, for example, approximately a sum of plane sizes of two adjacent first sub-pixels 10 and a plane size of a gap between the two. The plane size of the first pattern region 2 is significantly larger than a plane size of a single one first sub-pixel 10, so that a plane size of the opening of on the mask 6 for correspondingly forming the first sub-pixel 10 or the second sub-pixel 11 is increased as compared with a plane size of an opening of a mask in the prior art, which further reduces difficulty in fabricating the mask 6, meanwhile, reduces difficulty in the evaporation process, and improves life of the OLED display product; and at a same time, as compared with the opening of the mask in the prior art, a width of a gap between two adjacent first sub-pixels 10 or two adjacent second sub-pixels 11 is reduced, which, thus, improves the PPI and the aperture ratio of the OLED display product, and further improves brightness of the OLED display product.

Among four pixel units 1 adjacent to one another in a pairwise manner both in the row direction and the column direction (i.e., the second direction) in which pixel units 1 are arranged, two third sub-pixels 12 in two pixel units 1 adjacent in the row are adjacent to each other in the row direction, two third sub-pixels 12 in two pixel units 1 adjacent in the column are adjacent to each other in the column direction, and four third sub-pixels which are adjacent in the row and adjacent in the column are adjacent to one another, and active light-emitting regions of the four pixel units 1 are arranged within a second pattern region 3. For example, with reference to FIG. 1 and FIG. 3, a second light-emitting layer pattern L2 filling the second pattern region 3 is formed through a same one second opening P2 of another mask 6'. For example, the second pattern region 3 and the second opening P2 are substantially the same in shape and size. A plane size of the second pattern region 3 is a sum of plane sizes of four adjacent third sub-pixels 12 and a plane size of a gap among the four, that is, the plane size of the second pattern region 3 is significantly larger than the plane size of a single one third sub-pixel, so that a plane size of an opening of on the mask 6' for correspondingly forming the third sub-pixel 12 is increased as compared with the plane size of the opening of the mask in the prior art, which further reduces difficulty in fabricating the mask 6', and meanwhile, reduces difficulty in the evaporation process, and improves life of the OLED display product; at a same time, as compared with the opening of the mask in the prior art, a width of a gap among four adjacent third sub-pixels 12 is reduced, which, thus, improves the PPI and the aperture ratio of the OLED display product, and further improves brightness of the OLED display product, and in addition, reduces costs of the mask 6'.

It should be noted that, during evaporation, by rotated by 180°, the first opening P1 of the first light-emitting layer pattern for forming the two adjacent first sub-pixels 10 can be converted into the opening of the second light-emitting layer pattern for forming the two adjacent second sub-pixels 11. That is, with one mask 6 provided with a plurality of first openings L1, evaporation of the first sub-pixel 10 and the second sub-pixel 11 can be implemented, which, thus, saves costs of the mask 6.

Figure 3:
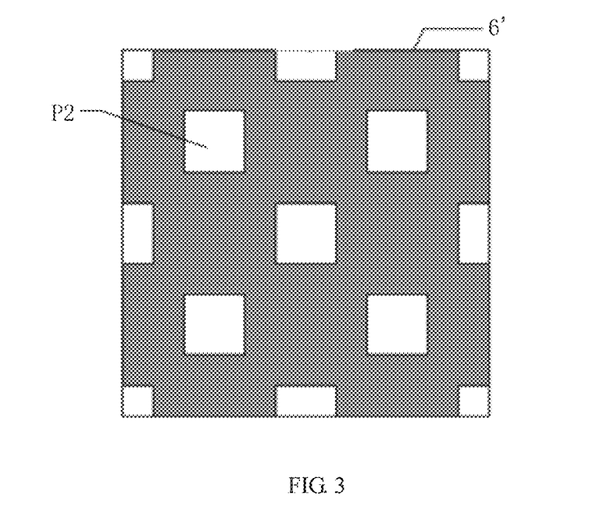
FIG. 3 is a top plan view of a structure of a mask with an opening of a second pattern region provided by the embodiment of the present disclosure.

In addition, it should be noted that, it is not necessary to reserve a mask pattern for forming a gap structure between two adjacent first sub-pixels 10 or two adjacent second sub-pixels 11 in the first mask; and it is not necessary to reserve a mask pattern for forming a gap structure among the four adjacent third sub-pixels 12 in the second mask 6'. Therefore, with respect to the opening of the mask in the prior art, plane sizes of openings of the mask for forming respective sub-pixels in this embodiment are further increased, which further reduces difficulty in fabricating the mask 6, and finally reduces difficulty in the evaporation process. A gap region between two adjacent first sub-pixels 10 or two adjacent second sub-pixels 11, for example, is formed with a pixel-defining structure and would not be powered during display driving, which, thus, implements insulation between two adjacent first sub-pixels 10 or two adjacent second sub-pixels 11; similarly, a gap region between the four adjacent third sub-pixels 12, for example, is formed with a pixel-defining structure and would not be powered during display driving, which, thus, implements insulation among the four adjacent third sub-pixels 12.

For example, in this embodiment, the first sub-pixel 10 and the second sub-pixel 11 have a shape of pentagon, and the third sub-pixel 12 has a shape of rectangle.

It should be noted that, the first sub-pixel 10 and the second sub-pixel 11 can also have other shapes such as triangle, pentagon, trapezoid, semicircle, or hexagon; and the third sub-pixel 12 can also have other shapes such as rectangle, circle, sector, triangle, trapezoid or hexagon.

In this embodiment, the first sub-pixel 10 is a red sub-pixel, the second sub-pixel 11 is a green sub-pixel, and the third sub-pixel 12 is a blue sub-pixel. The sub-pixels of the three colors can have a size proportion of their areas determined according to actual needs, as long as an expected display effect thereof can be achieved, and the size proportion of the areas of the sub-pixels of the three colors will not be limited.

In this embodiment, the setting of the sub-pixels of the three colors in the pixel unit 1 can not only enable the pixel unit 1 to display an actual color of the pixel unit 1 according to an actual arrangement mode of the sub-pixels of the three colors, but also can implement color display of the pixel unit 1 in a mode of algorithm rendering. A display function of two pixel units 1 can be implemented in one pixel unit 1, by mutually borrowing sub-pixels, so as to optimize a display effect. For example, in one pixel unit 1, one first sub-pixel 10 and one third sub-pixel 12, together with one second sub-pixel 11 borrowed, can implement a display function of one pixel unit 1; at a same time, one second sub-pixel 11 and one third sub-pixel 12, together with one first sub-pixel 10 borrowed, can implement a display function of another pixel unit 1.

Figure 4:
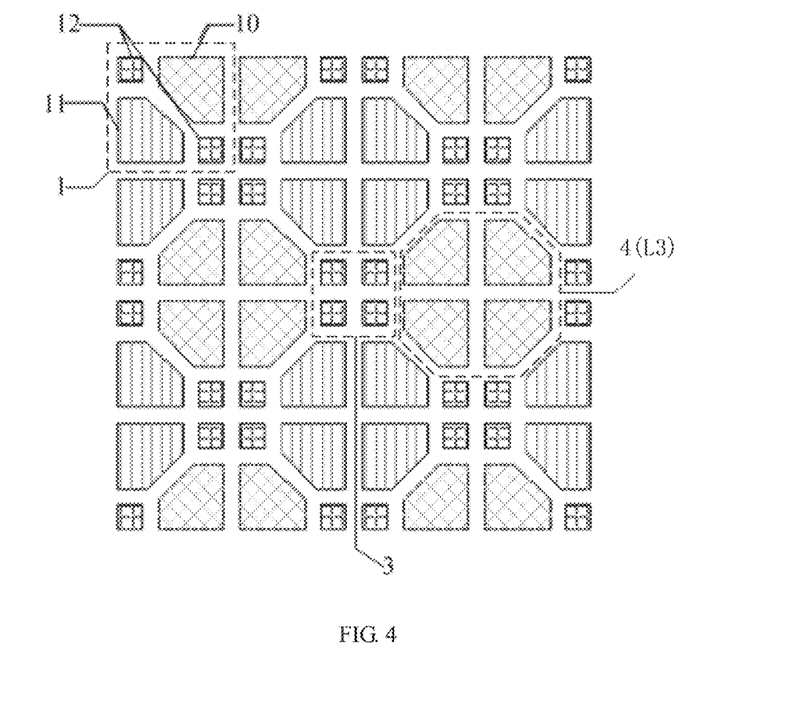
FIG. 4 is a top plan view of a structure of an OLED array substrate provided by an embodiment of the present disclosure.

An embodiment of the present disclosure provides an OLED array substrate, different from the above-described embodiment, as shown in FIG. 4, among four pixel units 1 adjacent to one another in a pairwise manner both in a row direction and a column direction in which pixel units 1 are arranged, two first sub-pixels 10 in two pixel units 1 adjacent in the row are adjacent to each other in the row direction, two first sub-pixels 10 in two pixel units 1 adjacent in the column are adjacent to each other in the column direction, and four first sub-pixels 10 adjacent both in the row and in the column are adjacent to one another, and the active light-emitting regions of the four first sub-pixels 10 are arranged within a third pattern region 4. For example, with reference to FIG. 4, a third light-emitting layer pattern L3 filling the third pattern region 4 is formed through a same third opening (not shown) of still another mask. For example, the third pattern region 4 and the third opening are substantially the same in shape and size.

Among four pixel units 1 adjacent to one another in a pairwise manner both in the row direction and the column direction in which pixel units 1 are arranged, two second sub-pixels 11 in two pixel units 1 adjacent in the row are adjacent to each other in the row direction, two second sub-pixels 11 in two pixel units 1 adjacent in the column are adjacent to each other in the column direction, and four second sub-pixels 11 adjacent both in the row and in the column are adjacent to one another, and the active light-emitting regions of the four second sub-pixels 11 are arranged within the third pattern region 4. Among four pixel units 1 adjacent to one another in a pairwise manner both in the row direction and the column direction in which pixel units 1 are arranged, two third sub-pixels 12 in two pixel units 1 adjacent in the row are adjacent to each other in the row direction, two third sub-pixels 12 in two pixel units 1 adjacent in the column are adjacent to each other in the column direction, and four third sub-pixels 12 adjacent both in the row and in the column are adjacent to one another, and the active light-emitting regions of the four third sub-pixels 12 are arranged within a second pattern region 3 (as shown in FIG. 3).

A plane size of the third pattern region 4 is a sum of plane sizes of the four adjacent first sub-pixels 10 (or plane sizes of the four adjacent second sub-pixels 11) and a plane size of a gap among the four, that is, the plane size of the third pattern region 4 is significantly larger than a plane size of the first sub-pixel 10 or the second sub-pixel 11, so that a plane size of an opening of the mask for correspondingly forming the first sub-pixel 10 or the second sub-pixel 11 is increased as compared with a plane size of an opening of a mask in the prior art, which further reduces difficulty in fabricating the mask, and meanwhile, reduces difficulty in an evaporation process, and improves life of an OLED display product; at a same time, as compared with the opening of the mask in the prior art, a width of a gap among the four adjacent first sub-pixels 10 (or the four adjacent second sub-pixels 11) is reduced, which, thus, improves PPI and an aperture ratio of the OLED display product, and further improves brightness of the OLED display product. Similarly, a plane size of the second pattern region 3 is a sum of plane sizes of the four adjacent third sub-pixels 12 and a plane size of a gap among the four, that is, the plane size of the second pattern region 3 is significantly larger than a plane size of the third sub-pixel 12, so that a plane size of an opening of the mask for correspondingly forming the third sub-pixel 12 on the mask is increased as compared with the plane size of the opening of the mask in the prior art, which further reduces difficulty in fabricating the mask, meanwhile, reduces difficulty in the evaporation process, and improves life of the OLED display product; at a same time, as compared with the opening of the mask in the prior art, a width of a gap among four adjacent third sub-pixels 12 is reduced, which, thus, improves the PPI and the aperture ratio of the OLED display product, and further improves brightness of the OLED display product, and in addition, reduces costs of the mask.

Other structural configurations of the OLED array substrate in this embodiment are the same as those according to the above-described embodiment, which will not be repeated here.

Figure 5:
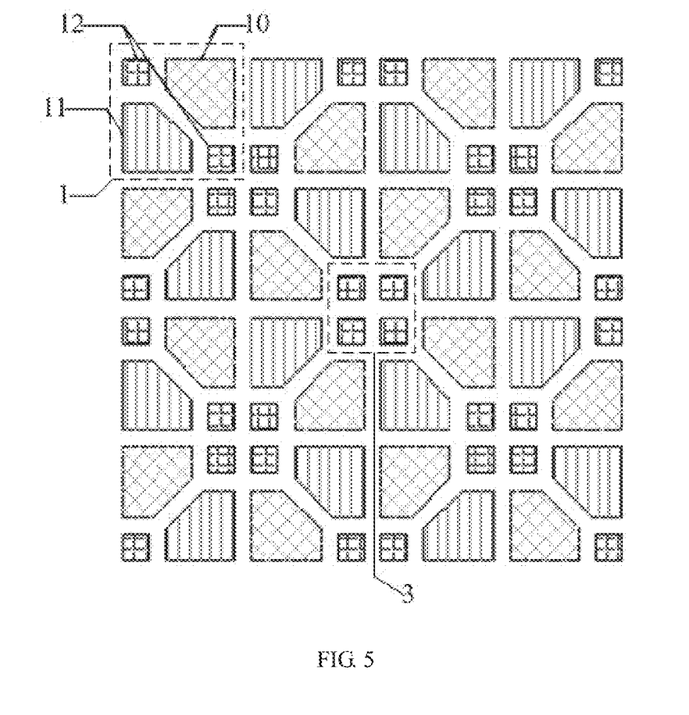
FIG. 5 is a top plan view of a structure of an OLED array substrate provided by an embodiment of the present disclosure.

An embodiment of the present disclosure provides an OLED array substrate, different from the above-described embodiment, as shown in FIG. 5, among four pixel units 1 adjacent to one another in a pairwise manner both in a row direction and a column direction in which pixel units 1 are arranged, two third sub-pixels 12 in two pixel units 1 adjacent in the row arc adjacent to each other in the row direction, two third sub-pixels 12 in two pixel units 1 adjacent in the column are adjacent to each other in the column direction, and four third sub-pixels 12 adjacent both in the row and in the column are adjacent to one another, and the active light-emitting regions of the four third sub-pixels 12 are arranged within a second pattern region 3 (as shown in FIG. 3). In the row direction and the column direction in which pixel units 1 are arranged, a first sub-pixel 10 and a second sub-pixel 11 in any two adjacent pixel units 1 are respectively adjacent in the row direction and in the column direction.

A plane size of the second pattern region 3 is a sum of plane sizes of the four adjacent third sub-pixels 12 and a plane size of a gap among the four, that is, the plane size of the second pattern region 3 is significantly larger than a plane size of a third sub-pixel 12, so that a plane size of an opening of a mask for correspondingly forming the third sub-pixel 12 is increased as compared with a plane size of an opening of a mask in the prior art, which further reduces difficulty in fabricating the mask, and meanwhile, reduces difficulty in an evaporation process, and improves life of an OLED display product; at a same time, as compared with the opening of the mask in the prior art, a width of a gap among four adjacent third sub-pixels 12 are reduced, which, thus, improves PPI and an aperture ratio of the OLED display product, and further improves brightness of the OLED display product, and in addition, reduces costs of the mask.

In addition, the first sub-pixel 10 and the second sub-pixel 11 can be respectively formed by evaporation with masks corresponding to their respective actual light-emitting layer patterns during evaporation. The first sub-pixel 10 and the second sub-pixel 11 are the same in both shape and size. Therefore, during evaporation, the light-emitting layer patterns of the first sub-pixel 10 and the second sub-pixel 11 can be respectively formed with only one mask provided with the pattern of the first sub-pixel 10, as long as when the pattern of the second sub-pixel 11 is to be formed, the mask having the light-emitting layer pattern of the first sub-pixel 10, only by rotated by 180°, can form the light-emitting layer pattern of the second sub-pixel 11, which, thus, saves costs of the mask.

Other structural configurations of the OLED array substrate in this embodiment are the same as those according to the above-described embodiment, which will not be repeated here.

Figure 6:
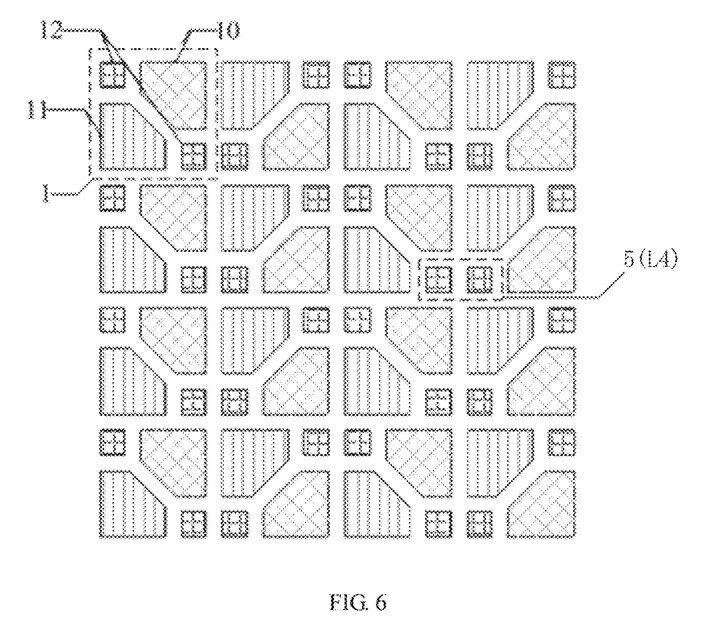
FIG. 6 is a top plan view of a structure of an OLED array substrate provided by an embodiment of the present disclosure.

An embodiment of the present disclosure provides an OLED array substrate, different from the above-described embodiment, as shown in FIG. 6, in a row direction or in a column direction in which pixel units 1 are arranged, two third sub-pixels 12 in two pixel units 1 adjacent in any row direction are adjacent to each other in the row direction, and active light-emitting regions of the two adjacent third sub-pixels 12 are arranged within a fourth pattern region 5. A fourth light-emitting layer pattern L4 filling the fourth pattern region 5 is formed through a same one fourth opening (not shown) of still another mask. In a row direction in which pixel units 1 are arranged, a first sub-pixel 10 and a second sub-pixel 11 in any two adjacent pixel units 1 are adjacent in the row direction. In a column direction in which pixel units 1 are arranged, a first sub-pixel 10 and a second sub-pixel 11 in any two adjacent pixel units 1 are diagonally adjacent.

Herein, a plane size of the fourth pattern region 5 is a sum of plane sizes of two adjacent third sub-pixels 12 and a plane size of a gap between the two, that is, the plane size of the fourth pattern region 5 is significantly larger than a plane size of the third sub-pixel 12, so that a plane size of an opening of the mask for correspondingly forming the third sub-pixel 12 is increased as compared with a plane size of an opening of a mask in the prior art, which further reduces difficulty in fabricating the mask, and meanwhile, reduces difficulty in an evaporation process, and improves life of an OLED display product; at a same time, as compared with the opening of the mask in the prior art, a width of a gap between two adjacent third sub-pixels 12 is reduced, which, thus, improves PPI and an aperture ratio of the OLED display product, and further improves brightness of the OLED display product.

In addition, the first sub-pixel 10 and the second sub-pixel 11 can be respectively formed by evaporation with masks corresponding to their respective actual light-emitting layer patterns during evaporation. The active light-emitting regions of the first sub-pixel 10 and the second sub-pixel 11 are the same in both shape and size. Therefore, during evaporation, the light-emitting layer patterns of the first sub-pixel 10 and the second sub-pixel 11 can be respectively formed with only one mask provided with the light-emitting layer pattern of the first sub-pixel 10. When the pattern of the second sub-pixel 11 is to be formed, the mask having the light-emitting layer pattern of the first sub-pixel 10, only by rotated by 180°, can form the light-emitting layer pattern of the second sub-pixel 11, which, thus, saves costs of the mask.

Other structural configurations of the OLED array substrate in this embodiment are the same as those according to any one of above-described embodiment, which will not be repeated here.

The OLED array substrate provided by the above-described embodiments of the present disclosure, by enabling light-emitting layer patterns of adjacent sub-pixels of the same color to be formed through one opening of the mask, can increase the size of the opening of the mask, and reduce a gap between adjacent sub-pixels, thus capable of improving the PPI and the aperture ratio of the OLED display product without increasing difficulty in fabricating the mask, that is, reducing difficulty in the fabrication process of the mask under the condition that the same PPI and the same aperture ratio of the OLED display product are ensured, which further reduces difficulty in the evaporation process of the sub-pixel, improves the yield of the OLED display product, and also improves brightness and life of the OLED display product, and meanwhile, reduces preparation costs of the OLED display product.

In the above-described embodiments of the present disclosure, each of the first light-emitting layer pattern to the fifth light-emitting layer pattern is a continuous light-emitting layer pattern.

Figure 7:
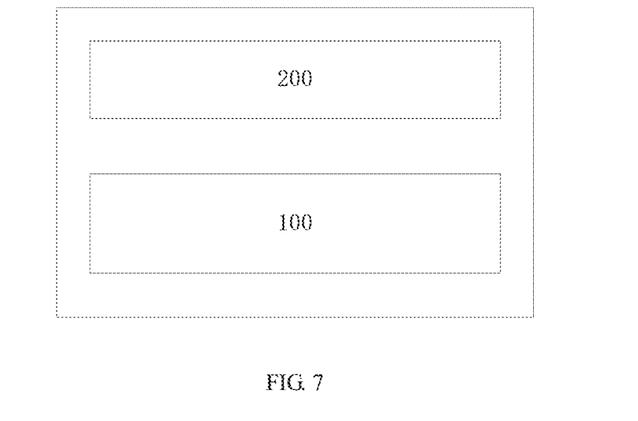
FIG. 7 is a block diagram of an OLED display device provided by an embodiment of the present disclosure.

An embodiment of the present disclosure provides a display device, as shown in FIG. 7, including the OLED array substrate 100 provided by any one of the above-described embodiments and a package substrate 200 provided opposite to the LED array substrate.

With the OLED array substrate provided by any one of the above-described embodiments, fabrication difficulty of the display device is reduced, and PPI and an aperture ratio of the display device are improved, so that brightness and life of the display device are improved, and fabrication costs of the display device are reduced.

The display device provided by the embodiment of the present disclosure can be an OLED panel, an OLED TV, a display, a mobile phone, a navigator, and any other product or component having an organic electroluminescence display function.

Figure 8:
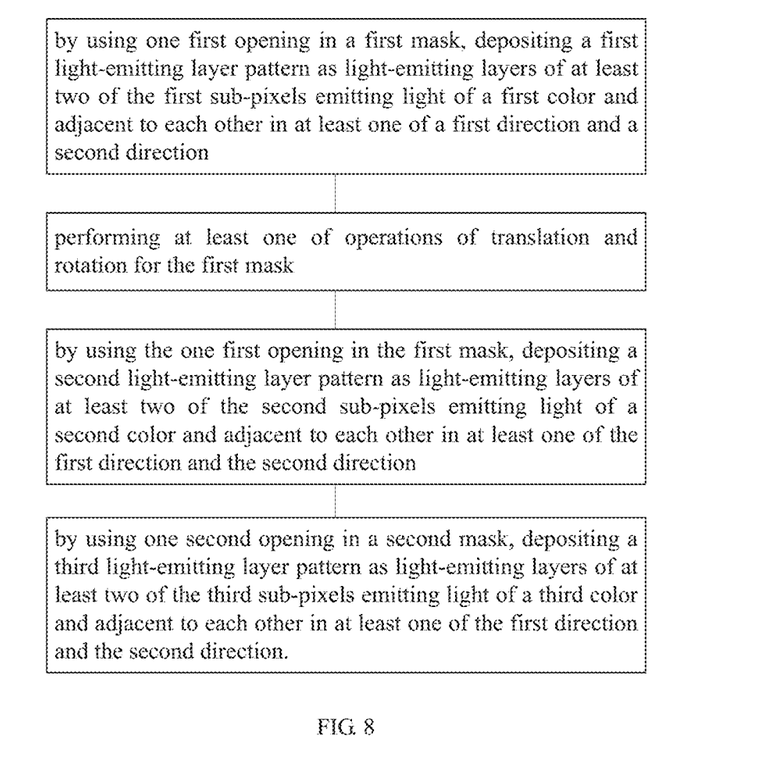
FIG. 8 is a flow chart of a manufacturing method of an OLED array substrate provided by an embodiment of the present disclosure.

Still another embodiment of the present disclosure provides a manufacturing method of an OLED array substrate, as shown in FIG. 8, including:

by using one first opening in a first mask, depositing a first light-emitting layer pattern as light-emitting layers of at least two of the first sub-pixels emitting light of a first color and adjacent to each other in at least one of a first direction and a second direction;

performing at least one of operations of translation and rotation for the first mask;

by using the one first opening in the first mask, depositing a second light-emitting layer pattern as light-emitting layers of at least two of the second sub-pixels emitting light of a second color and adjacent to each other in at least one of the first direction and the second direction; and by using one second opening in a second mask, depositing a third light-emitting layer pattern as light-emitting layers of at least two of the third sub-pixels emitting light of a third color and adjacent to each other in at least one of the first direction and the second direction.

It is understood that, the foregoing embodiments merely are exemplary embodiments used for explaining the principles of the embodiments of the present disclosure; however, the embodiments of the present disclosure are not limited thereto. An ordinarily skilled in the art can also make various variations and improvements within the spirit and substance of the embodiments of the present disclosure; these variations and improvements are also deemed to belong to the scope of the present disclosure, and the protection scope of the present disclosure is determined by the appended claims.

The invention claimed is:

1. An OLED array substrate, comprising a base substrate and a plurality of pixel units thereon, wherein, the plurality of pixel units is arranged in a plurality of rows extending in a first direction and a plurality of columns extending in a second direction, each of the pixel units includes a plurality of sub-pixels emitting light of different colors, at least two of the sub-pixels emitting light of a same color are adjacent to each other in at least one selected from the group consisting of the first direction and the second direction,
wherein, the sub-pixels of each of the pixel units include one first sub-pixel, one second sub-pixel and two third sub-pixels; the first sub-pixel, the second sub-pixel and the third sub-pixel emit light of different colors, and the two third sub-pixels emit light of a same color;
the first sub-pixel and the second sub-pixel are diagonally provided, the two third sub-pixels are diagonally provided, and a connection line between the first sub-pixel and the second sub-pixel and a connection line between the two third sub-pixels intersect with each other, the first sub-pixel and the second sub-pixel each are across a first diagonal line of the pixel unit, and the two third sub-pixels each are across a second diagonal line of the pixel unit,
wherein a planar shape of each sub-pixel in each pixel unit is a polygon with all interior angles that is equal to or more than 90°.

2. The OLED array substrate according to claim 1, wherein, light-emitting layers of the at least two sub-pixels emitting light of the same color and adjacent to each other in at least one selected from the group consisting of the first direction and the second direction are integrally formed.

3. The OLED array substrate according to claim 1, wherein, light-emitting regions of the first sub-pixel and the second sub-pixel are the same in size and shape, and light-emitting regions of the two third sub-pixels are the same in size and shape.

4. The OLED array substrate according to claim 1, comprising:
a continuous first light-emitting layer pattern, wherein, an orthographic projection of light-emitting regions of at least two of the first sub-pixels adjacent to each other in at least one selected from the group consisting of the first direction and the second direction on the base substrate is located within an orthographic projection of the first light-emitting layer pattern on the base substrate;

a continuous second light-emitting layer pattern, wherein, an orthographic projection of light-emitting regions of at least two of the second sub-pixels adjacent to each other in at least one selected from the group consisting of the first direction and the second direction on the base substrate is located within an orthographic projection of the second light-emitting layer pattern on the base substrate; and a continuous third light-emitting layer pattern, wherein, a orthographic projection of light-emitting regions of at least four of the third sub-pixels adjacent to one another in the first direction and the second direction on the base substrate is located within an orthographic projection of the third light-emitting layer pattern on the base substrate.

5. The OLED array substrate according to claim 4, wherein, the first light-emitting layer pattern, the second light-emitting layer pattern and the third light-emitting layer pattern all have a planar shape of convex polygon.

6. The OLED array substrate according to claim 1, comprising:
a continuous light-emitting layer pattern, wherein, an orthographic projection of light-emitting regions of at least two of the third sub-pixels adjacent to each other in at least one selected from the group consisting of the first direction and the second direction on the base substrate is located within an orthographic projection of the light-emitting layer pattern on the base substrate.

7. The OLED array substrate according to claim 6, wherein, the light-emitting layer pattern has a planar shape of convex polygon.

8. The OLED array substrate according to claim 1, wherein, the first sub-pixel is a red sub-pixel, the second sub-pixel is a green sub-pixel, and the third sub-pixels are blue sub-pixels.

9. A display device, comprising the OLED array substrate according to claim 1.

10. A manufacturing method of the OLED array substrate according to claim 1, comprising:
by using one first opening in a first mask, depositing a first light-emitting layer pattern as light-emitting layers of at least two of the first sub-pixels emitting light of the first color and adjacent to each other in at least one selected from the group consisting of a first direction and a second direction.

11. The manufacturing method of the OLED array substrate according to claim 10,
wherein, an orthographic projection of light-emitting regions of at least two of the first sub-pixels adjacent to each other in at least one selected from the group consisting of the first direction and the second direction on the base substrate is located within a orthographic projection of the first light-emitting layer pattern on the base substrate.

12. The manufacturing method of the OLED array substrate according to claim 11, wherein, after depositing the first light-emitting layer pattern, the manufacturing method further comprises:
by using the one first opening in the first mask, depositing a second light-emitting layer pattern as light-emitting layers of at least two of the second sub-pixels emitting light of the second color and adjacent to each other in at least one selected from the group consisting of the first direction and the second direction; wherein, an orthographic projection of light-emitting regions of the at least two of the second sub-pixels adjacent to each other in at least one selected from the group consisting of the first direction and the second direction on the base substrate is located within an orthographic projection of the second light-emitting layer pattern on the base substrate.

13. The manufacturing method of the OLED array substrate according to claim 12, wherein, after depositing the first light-emitting layer pattern and before depositing the second light-emitting layer pattern, the manufacturing method further comprises: performing at least one selected from the group consisting of operations of translation and rotation for the first mask.

14. The manufacturing method of the OLED array substrate according to claim 11, further comprising: by using one second opening in a second mask, depositing a third light-emitting layer pattern as light-emitting layers of at least two of the third sub-pixels emitting light of a same color and adjacent to each other in at least one selected from the group consisting of the first direction and the second direction; wherein, an orthographic projection of light-emitting regions of the at least two of the third sub-pixels adjacent to each other in at least one selected from the group consisting of the first direction and the second direction on the base substrate is located within an orthographic projection of the third light-emitting layer pattern on the base substrate.

* * * * *